(12) United States Patent
Chen et al.

(10) Patent No.: US 10,181,449 B1
(45) Date of Patent: Jan. 15, 2019

(54) SEMICONDUCTOR STRUCTURE

(71) Applicant: Taiwan Semiconductor Manufacturing Co., Ltd., Hsinchu (TW)

(72) Inventors: Jie Chen, New Taipei (TW); Hsien-Wei Chen, Hsinchu (TW); Ying-Ju Chen, Yunlin County (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/717,971

(22) Filed: Sep. 28, 2017

(51) Int. Cl.
  *H01L 23/00* (2006.01)
(52) U.S. Cl.
  CPC ...... *H01L 24/24* (2013.01); *H01L 2224/2405* (2013.01); *H01L 2224/24011* (2013.01); *H01L 2224/24101* (2013.01); *H01L 2224/24137* (2013.01)
(58) Field of Classification Search
  CPC ........... H01L 24/24; H01L 2224/24011; H01L 2224/2405
  See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,874 | B2 | 6/2015 | Edelstein et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |

(Continued)

FOREIGN PATENT DOCUMENTS

| | | |
|---|---|---|
| CN | 101373750 | 2/2009 |
| TW | 201635463 | 10/2016 |

OTHER PUBLICATIONS

"Office Action of Taiwan Counterpart Application", dated May 3, 2018, p. 1-p. 6.

*Primary Examiner* — Nathan W Ha
(74) *Attorney, Agent, or Firm* — JCIPRNET

(57) ABSTRACT

A semiconductor structure including an insulating encapsulant, a first semiconductor die, a second semiconductor die and a redistribution circuit layer is provided. The first and the second semiconductor dies embedded in the insulating encapsulant and separated from one another. The first semiconductor die includes a first active surface accessibly exposed and a first conductive terminal distributed at the first active surface. The second semiconductor die includes a second active surface accessibly exposed and a second conductive terminal distributed at the second active surface. The redistribution circuit layer including a conductive trace is disposed on the first and the second active surfaces and the insulating encapsulant. The conductive trace is electrically connected from the first semiconductor die and meanderingly extends to the second semiconductor die, and a ratio of a total length of the conductive trace to the top width of the insulating encapsulant ranges from about 3 to about 10.

20 Claims, 6 Drawing Sheets

(56) References Cited

U.S. PATENT DOCUMENTS

| | | | |
|---|---|---|---|
| 2008/0135977 A1* | 6/2008 | Meyer | H01L 24/82 257/531 |
| 2009/0032914 A1* | 2/2009 | Kwon | H01L 21/4857 257/664 |
| 2010/0224969 A1* | 9/2010 | Tang | H01L 21/6835 257/660 |
| 2010/0258944 A1* | 10/2010 | Uchiyama | H01L 23/5384 257/773 |
| 2013/0082374 A1* | 4/2013 | Crisp | H01L 24/19 257/693 |
| 2013/0105950 A1* | 5/2013 | Bergemont | H01L 23/552 257/659 |
| 2013/0171752 A1* | 7/2013 | Val | H01L 22/14 438/15 |
| 2014/0015131 A1* | 1/2014 | Meyer | H01L 23/49816 257/738 |
| 2014/0061954 A1* | 3/2014 | Hu | H01L 21/561 257/783 |
| 2015/0255416 A1* | 9/2015 | Kim | H01L 23/3157 257/773 |
| 2016/0071829 A1* | 3/2016 | Yu | H01L 21/56 257/773 |
| 2018/0102343 A1* | 4/2018 | Lin | H01L 25/0655 |

* cited by examiner

SEMICONDUCTOR STRUCTURE

BACKGROUND

In an aspect of conventional semiconductor packaging technologies, such as integrated fan-out wafer level packaging (InFO-WLP), redistribution layers (RDLs) may be formed over a die and electrically connected to active devices in a die. In addition, a molding compound may be formed around the die to provide surface area to support the fan-out interconnect structures. For example, RDLs including circuit routing layers are typically formed over both the die and the molding compound.

In such semiconductor package structures, heat causes both die and the molding compound to expand at their respective coefficients of thermal expansion (CTE) during operation. It is tensile stress concentration that develops due to the CTE mismatch between the die and the molding compound. However, such stress could potentially damage the circuit routing layer. For example, crack or break under thermal stress may occur in the circuit routing layer so that a circuit failure results. Accordingly, there is a need semiconductor package structures that increases the reliability and protects the circuit routing layer against tensile stress.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
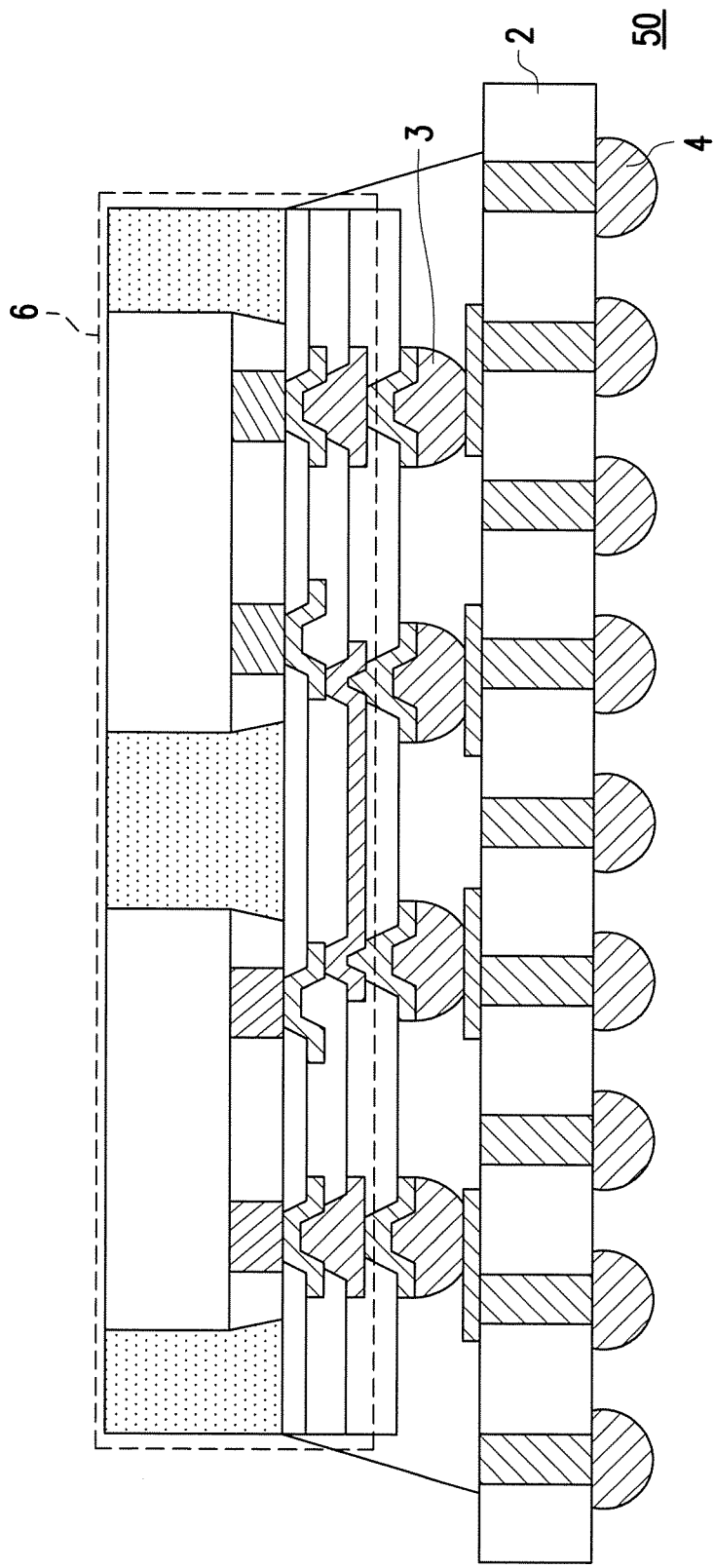
FIG. 1 is the schematic cross-sectional view illustrating an integrated fan-out package according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1 is the schematic cross-sectional view illustrating a semiconductor package according to some embodiments of the present disclosure. Referring to FIG. 1, in some embodiments, an integrated fan-out package 50 may include a circuit substrate 2, external terminals 4 mounted on a lower surface of the circuit substrate 2 and electrically connected to the circuit substrate 2 and a semiconductor structure 6 disposed on an upper surface of the circuit substrate 2. The upper surface is opposite to the lower surface. In other words, the external terminals 4 and the semiconductor structure 6 are disposed opposite sides of the circuit substrate 2. In some embodiments, the circuit substrate 2 may be a printed circuit board including patterned conductive layers and patterned dielectric layers stacked alternately, and the external terminals 4 mounted on the lower surface of the circuit substrate 2 may be solder balls arranged in grid array. For example, the semiconductor structure 6 may be formed first and then mounted on and electrically connected to the circuit substrate 2 through conductive bumps 3. The integrated fan-out package 50 may include multiple semiconductor dies and the integrated fan-out package 50 is electrically connected to the circuit substrate 2 through the conductive bumps 3 (e.g., controlled collapse chip connection bumps; namely C4 bumps). The details with respect to the embodiments of semiconductor structure 6 will be described as follows.

Figure 2A:
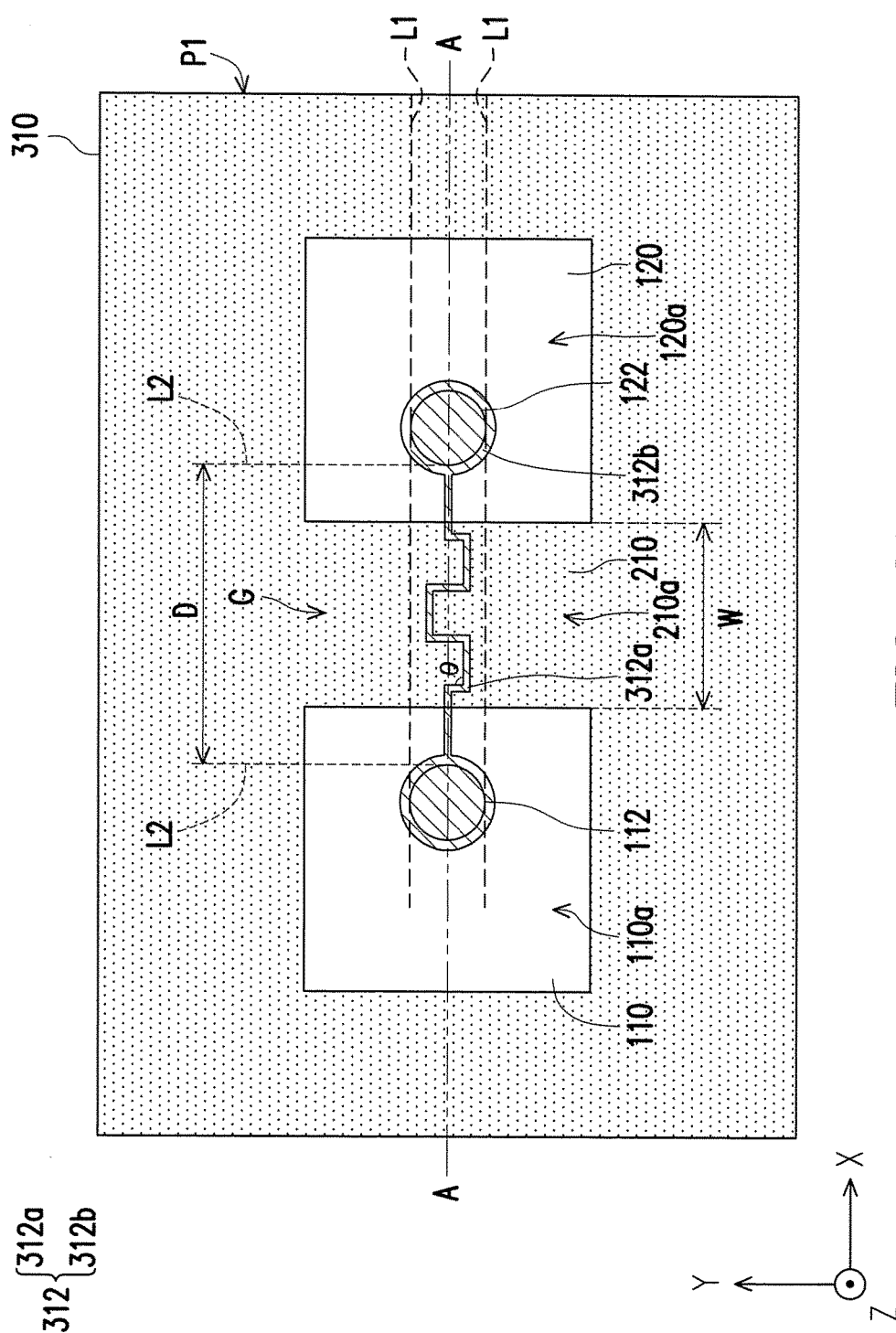
FIG. 2A is the schematic top view illustrating a semiconductor structure according to some embodiments of the present disclosure.
Figure 2B:
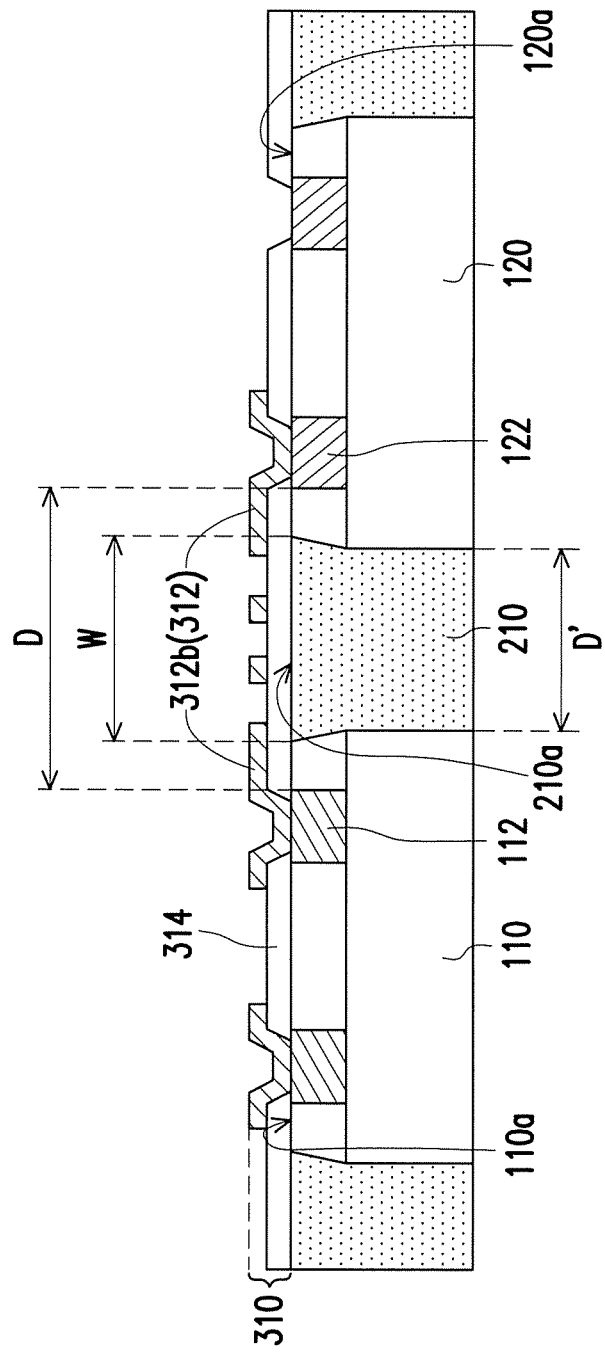
FIG. 2B is the schematic cross-sectional view along the line A-A of the semiconductor structure in FIG. 2A.

FIG. 2A is the schematic top view illustrating a semiconductor structure according to some embodiments of the present disclosure and FIG. 2B is the schematic cross-sectional view along the line A-A of the semiconductor structure in FIG. 2A. Referring to FIG. 2A and FIG. 2B, in some embodiments, a semiconductor structure 10 includes a plurality of semiconductor dies 100 (e.g. a first semiconductor die 110 and a second semiconductor die 120), an insulating encapsulant 210 and a redistribution circuit layer 310 electrically connected to the semiconductor dies 100. In some embodiments, each of the semiconductor dies 100 comprises an active surface and a conductive terminal distributed at the active surface. For example, the first semiconductor die 110 includes a first active surface 110a and at least one first conductive terminal 112 distributed at the first active surface 110a and the second semiconductor die 120 includes a second active surface 120a and at least one second conductive terminal 122 distributed at the second active surface 120a. It should be noted that the number of the semiconductor dies 100 in the figures merely serves as an exemplary illustration and the disclosure is not limited thereto. In some alternative embodiments, more semiconductor dies 110 may be adapted to form the semiconductor structure 10.

In some embodiments, the insulating encapsulant 210 may laterally encapsulate sidewalls of the semiconductor dies 100 such that the semiconductor dies 100 may be spaced apart from one another by the insulating encapsulant. For example, a gap G may be between the first semiconductor die 110 and the second semiconductor die 120 and the insulating encapsulant 210 may be located in and fill the gap G to spatially separate the first semiconductor die 110 and the second semiconductor die 120. In other words, the first semiconductor die 110 and the second semiconductor die 120 may be separately embedded in the insulating encapsulant. For example, the insulating encapsulant 210 may include an insulating material or polymer composite material formed by compressive molding, transfer molding, or other suitable forming process. In some embodiments, the first active surface 110a of the first semiconductor die 110 and the second active surface 120a of the second semiconductor die 120 may be accessibly exposed by the insulating encapsulant 210 such that the first conductive terminal 112 and the second conductive terminal 122 may be accessibly exposed by the insulating encapsulant 210 for further electrical connection.

As shown in FIG. 2A, the first conductive terminal 112 of the first semiconductor die 110 and the second conductive terminal 122 of the second semiconductor die 120 may have a pair of parallel tangents L1 in an X direction and a pair of parallel tangents L2 in a Y direction which is perpendicular to the X direction. In other words, the parallel tangents L1 may be substantially perpendicular to the parallel tangents L2. In some embodiments, a shortest distance D between the first conductive terminal 112 of the first semiconductor die 110 and the second conductive terminal 122 of the second semiconductor die 120 may be measured between the parallel tangents L2. The shortest distance D may be greater than a top width W of the insulating encapsulant 210 between the first semiconductor die 110 and the second semiconductor die 120 and less than 3 times of the top width W of the insulating encapsulant 210. In some circumstances, the top width W of the insulating encapsulant 210 between the first semiconductor die 110 and the second semiconductor die 120 is greater than a distance D' between the sidewall of the first semiconductor die 110 facing towards the second semiconductor die 120 and the side wall of the second semiconductor die 120 facing towards the first semiconductor die 110. For example, a top portion (not illustrated) of the insulating encapsulant 210 between the first conductive terminal 112 and the second conductive terminal 122 may have a wide top and a narrow bottom in the cross-sectional view.

In some embodiments, the first active surface 110a of the first semiconductor die 110 and the second active surface 120a of the second semiconductor die 120 may be substantially coplanar with a top surface 210a of the insulating encapsulant 210. The redistribution circuit layer 310 may be disposed on the first active surface 110a, the second active surface 120a and the top surface 210a of the insulating encapsulant 210. For example, the redistribution circuit layer 310 may extend laterally beyond external perimeters of conductive terminals to provide fan-out interconnect structures. For example, the conductive terminals (e.g. the first conductive terminal 112 and the second conductive terminal 122) may include copper vias. In some embodiments, the redistribution circuit layer 310 may include at least one conductive trace 312. The conductive trace 312 may be electrically connected from the first conductive terminal 112 of the first semiconductor die 110 and meanderingly extends to the second conductive terminal 122 of the second semiconductor die 120. As used herein, the conductive trace 312 meanderingly extending to the second conductive terminal 122 may include any electrical trace that is longer than the shortest distance between the conductive terminals that it connects, or any electrical trace of sufficient length so as to maintain electrical conductivity. For example, the electrical path of the conductive trace 312 meanderingly extending from the first conductive terminal 112 to the second conductive terminal 122 may be configured as traces having successive curves, bending or the like. In other words, the conductive trace 312 may be electrically connected to the semiconductor dies 100 and reroute electrical signals to provide access for further electrical connection. For example, a total length of the conductive trace 312 may approximately range from 50 µm to 500 µm. In some embodiments, the total length of the conductive trace 312 may be greater than the shortest distance D and at least 3 times greater than the top width W of the insulating encapsulant 210. For example, a ratio of the total length of the conductive trace 312 to the top width W of the insulating encapsulant 210 ranges from about 3 to about 10. In some circumstances, the shortest distance D is less than 3 times of the top width W of the insulating encapsulant 210. If the electrical path of the conductive trace 312 connected between the first conductive terminal 112 and the second conductive terminals 122 is linear in such circumstances, the tensile stress resulting from the CTE mismatch may negatively affect the conductive trace 312, for example, the conductive trace 312 may tend to crack. Since the conductive trace 312 meanderingly extends between the semiconductor dies 100 in order to increase the total length of the conductive trace 312, thereby improving the tolerance capability of conductive trace 312 to the tensile stress resulting from the CTE mismatch.

In some embodiments, the conductive trace 312 of the redistribution circuit layer 310 may include at least one turning segment 312a corresponding to the insulating encapsulant 210. As shown in FIG. 2A, for example, the turning segments 312a are located above the insulating encapsulant 210. In some embodiments, the turning segments 312a may be located above the first semiconductor die 110 and/or the second semiconductor die 120. In some other embodiments, the turning segments 312a may be locate above the interface between the semiconductor dies 100 and the insulating encapsulant 210 in the top view depend on the design requirement. The turning segments 312a may be located at a plane P1 substantially parallel to the first active surface 110a of the first semiconductor die 110 and the second active surface 120a of the second semiconductor die 120. For example, the plane P1 may be the X-Y plane.

In some embodiments, the conductive trace 312 may be formed as a zigzag conductive pattern corresponding to the insulating encapsulant 210. In some other embodiments, the electrical path of the turning segments 312a of the conductive trace 312 may be formed as an angular path. For example, an angle θ of the electrical path of the turning segments 312a may include acute angle, right angle or obtuse angle. Multiple turning segments 312a may be connected to one another to form a meandering pattern. In some embodiments, the electrical path of the turning segments 312a may be curve path. For example, the meandering pattern may be sinusoidally distributed between the first conductive terminal 112 and the second conductive terminal 122 of the second semiconductor die 120. In some embodiments, the zigzag conductive pattern may be formed as a regular pattern. For example, the zigzag conductive pattern may be symmetrical relative to the center of the insulating encapsulant 210. In some other embodiments, the zigzag conductive pattern may be formed as an irregular pattern depending on the routing design requirement.

In some other embodiments, the conductive trace 312 may include conductive pads 312b formed on the first conductive terminal 112 and the second conductive terminal 122. In some embodiments, the layout area of the conductive trace 312 may be located between the parallel tangents L1 of the first conductive terminal 112 and the second conductive terminal 122. In some other embodiments, the layout area of the conductive trace 312 may be between and/or outside the parallel tangents L1 of the first conductive terminal 112 and the second conductive terminal 122 depending on the routing design requirement.

For example, the redistribution circuit layer 310 may include a dielectric layer 314 formed over the first active surface 110a, the second active surface 120a and the top surface 210a of the insulating encapsulant 210. In some embodiments, the dielectric layer may include photo-patternable insulating materials such as polyimide, benzocyclobutene (BCB), polybenzoxazole (PBO), the like, or a combination thereof, and may be formed by chemical vapor deposition (CVD), physical vapor deposition (PVD), atomic layer deposition (ALD), a spin-on-dielectric process, the like, or a combination thereof.

In some embodiments, the dielectric layer 314 may be patterned to form a plurality of openings (not illustrated) exposing at least the surface of the conductive terminals of the semiconductor dies 100 using, e.g., a photolithography technique or other suitable process. In some other embodiments, the conductive trace 312 may be formed by depositing a seed layer (not illustrated) over the dielectric layer 314 and in the openings. The seed layer may include conductive materials such as copper, titanium, nickel, gold, the like, or a combination thereof. Next, a photoresist material (not illustrated) may be deposited over the seed layer and patterned to define the desired pattern such as the zigzag conductive pattern. A material of the conductive trace, such as copper, aluminum, silver, gold, the like, or a combination thereof, and may be formed on the seed layer by an electro-chemical plating process, an electroless plating process, PVD, ALD, the like, or a combination thereof. Subsequently, the photoresist material may be removed using the appropriate photoresist removal process. In some embodiments, the conductive trace 312 may be formed before the dielectric layer 314. The forming sequence of the conductive trace 312 and the dielectric layer 314 construes no limitation in the disclosure.

In some embodiments, the exposed portions of the seed layer over the dielectric layer 314 may be removed using, for example, an etching process or other suitable process. In some other embodiments, a passivation layer (not illustrated) may be formed over the conductive trace 312 to protect from being damaged. Other possible shapes of the conductive trace 312 may be utilized as long as a ratio of a total length of the conductive trace 312 to the top width W of the insulating encapsulant 210 may range from about 3 to about 10. As such, the semiconductor structure 10 may withstand the tensile stress resulting from the CTE mismatch between the semiconductor dies 100 and the insulating encapsulant 210 and eliminate the negative effect causing by the crack of the redistribution circuit layer 310 such that the reliability of the semiconductor structure 10 may be improved.

Figure 3A:
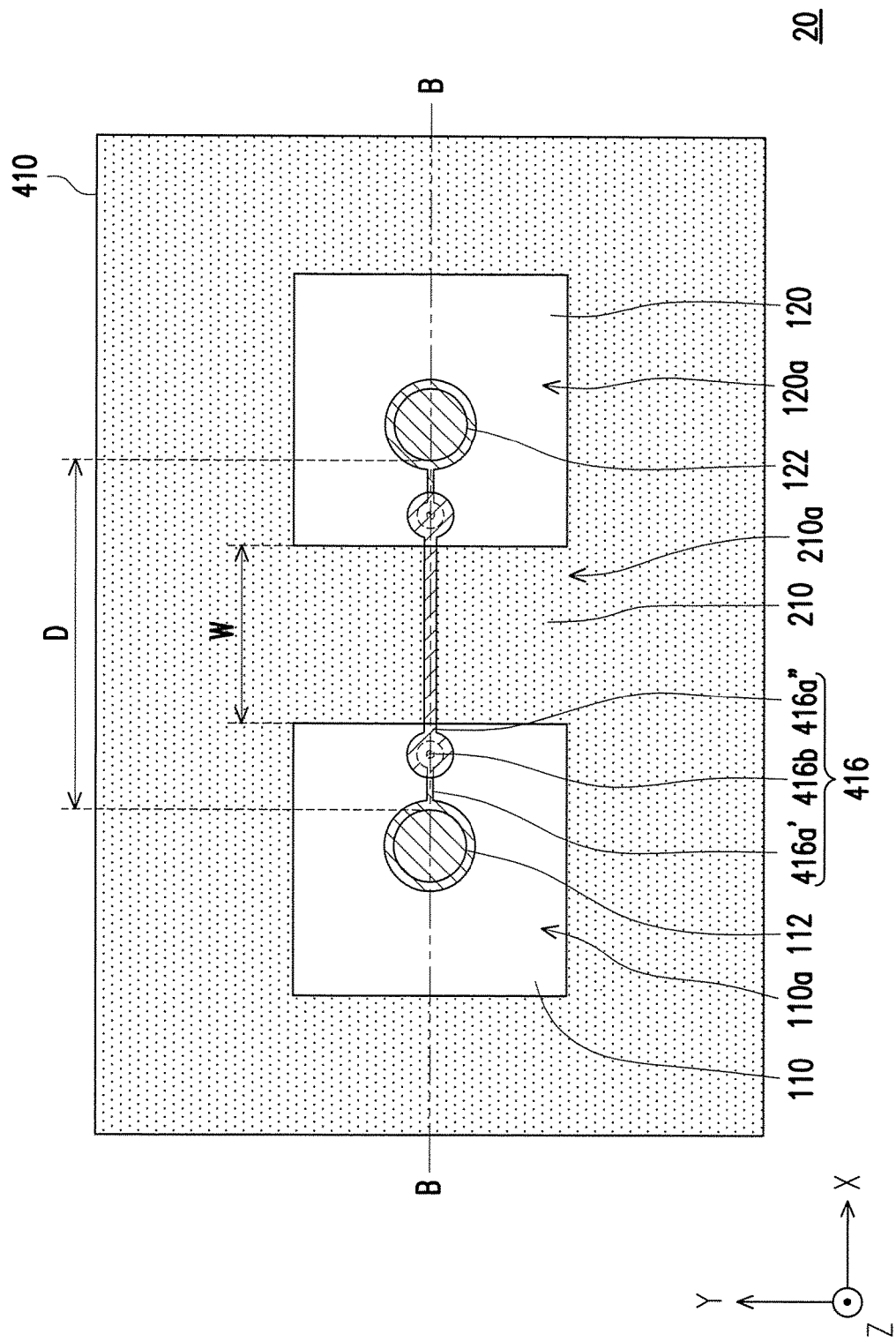
FIG. 3A is the schematic top view illustrating a semiconductor structure according to some embodiments of the present disclosure.
Figure 3B:
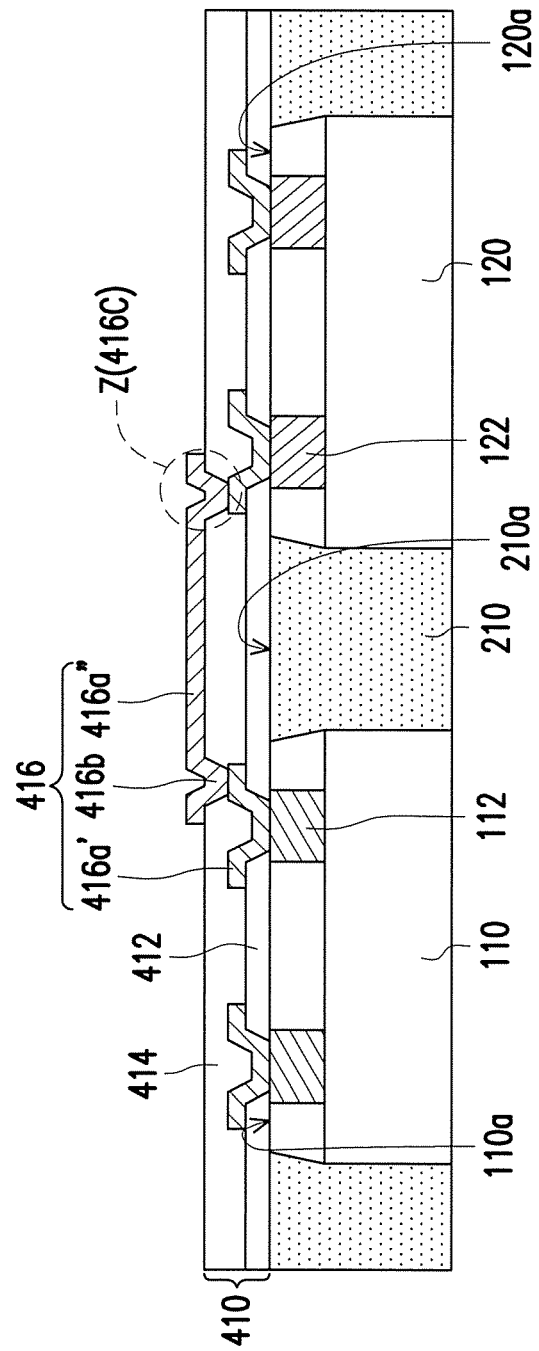
FIG. 3B is the schematic cross-sectional view along the line B-B of the semiconductor structure in FIG. 3A.

FIG. 3A is the schematic perspective view illustrating a semiconductor structure according to some embodiments of the present disclosure and FIG. 3B is the schematic cross-sectional view along the line B-B of the semiconductor structure in FIG. 3A. Referring to FIG. 3A and FIG. 3B, a semiconductor structure 20 of the present embodiment is similar to the semiconductor structure 10 of the embodiment illustrated in FIG. 2A. The identical or similar numbers refer to the identical or similar elements throughout the drawings, and the detail thereof is not repeated. The difference between the semiconductor structure 20 and the semiconductor structure 10 of FIG. 2A lies in that the redistribution circuit layer 410 may include more than one conductive feature (e.g., conductive traces and/or conductive vias).

In some embodiments, the redistribution circuit layer 410 may include a first dielectric layer 412 and a second dielectric layer 414. For example, the first dielectric layer 412 may be formed and patterned to form openings (not illustrated) on the first semiconductor die 110, the second semiconductor die 120 and the top surface 210a of the insulating encapsulant 210. The openings of the first dielectric layer 412 may expose part of the conductive terminals (e.g. 112 and 122) of the semiconductor dies 100. Next, a first level 416a' of the first trace 416a of the conductive trace 416 may be formed on the first dielectric layer 412 and in the openings. The forming methods and the materials of the first dielectric layer 412 and the conductive trace 416 may be similar with the dielectric layer 314 and the conductive trace 312. The detailed descriptions are omitted. Subsequently, the second dielectric layer 414 may be formed on the first dielectric layer 412 and patterned to have openings exposing part of the first trace 416a. Next, a plurality of conductive vias 416b may be formed in the openings of second dielectric layer 414 and a second level 416a" of the first trace 416a may be formed on the conductive vias 416b and on the second dielectric layer 414. In other words, the first level 416a' and the second level 416a" of the first trace 416a may be electrically connected through the conductive vias 416b. In some embodiments, the conductive vias 416b and the second level 416a" of the first trace 416a may be formed in the same process. The forming processes of the second level 416a" may be similar with the forming processes of the first trace 416a and the conductive trace 310 such that the detailed descriptions are omitted. In some embodiments, the first trace 416a including the first level 416a' and the second level 416a" may be located at a first plane (not illustrated) substantially parallel to the first active surface 110a and the second active surface 120a.

In some embodiments, the conductive vias 416b with part of the first level 416a' and part of the second level 416a" of the first trace 416a connected to the conductive vias 416b may be referred as a second trace 416c. The second trace 416c may be formed as the zigzag conductive pattern (as the slash area of circle Z in FIG. 3B) and referred as the turning segments of the conductive trace 416 in the cross-sectional view. In some embodiments, the second trace 416c may be formed above the insulating encapsulant 210. In some other embodiments, the second trace 416c may be located at a second plane (as the cross-sectional plane along the B-B line in FIG. 3A) substantially perpendicular to the first active surface 110a of the first semiconductor die 110 and the second active surface 120a of the second semiconductor die 120. In some embodiments, the total length of the second level 416a" of the first trace 416a of the conductive trace 416 may be between the shortest distance D and the top width W of the insulating encapsulant 210. In some other embodiments, the total length of the second trace 416c of the conductive trace 416 may be greater than the shortest distance D between the first conductive terminal 112 and the second conductive terminal 122.

In some embodiments, the turning segments of the conductive trace 416 may be formed symmetrically relative to the insulating encapsulant 210 above the active surfaces (e.g. the first active surface 110a and the second active surface 110b) of the semiconductor dies 100. In some embodiments, the turning segments of the conductive trace 416 may be corresponding to the first active surface 110a and/or the second active surface 120a and/or the top surface 210a of the insulating encapsulant 210. In some embodiments, the turning segments of the conductive trace 416 may be located above the interface between the semiconductor dies 100 and the insulating encapsulant 210 in the cross-sectional view. In some embodiments, the conductive vias 416b may have a tapered sidewall. In some other embodiments, the conductive vias 416b may have vertical sidewalls. By alternately repeating the above steps, the formation of the redistribution circuit layer 410 is completed.

In the semiconductor structure 20, the conductive vias 416b may provide a communication path between the first portion 416a and the second portion 416c. The conductive vias 416b may contribute an extending path for the routing of the conductive trace 416. As such, the semiconductor structure 20 may withstand the tensile stress resulting from the CTE mismatch between the semiconductor dies 100 and the insulating encapsulant 210 and eliminate the negative effect causing by the crack of the redistribution circuit layer 410 such that the reliability of the semiconductor structure 20 may be improved.

Figure 4:
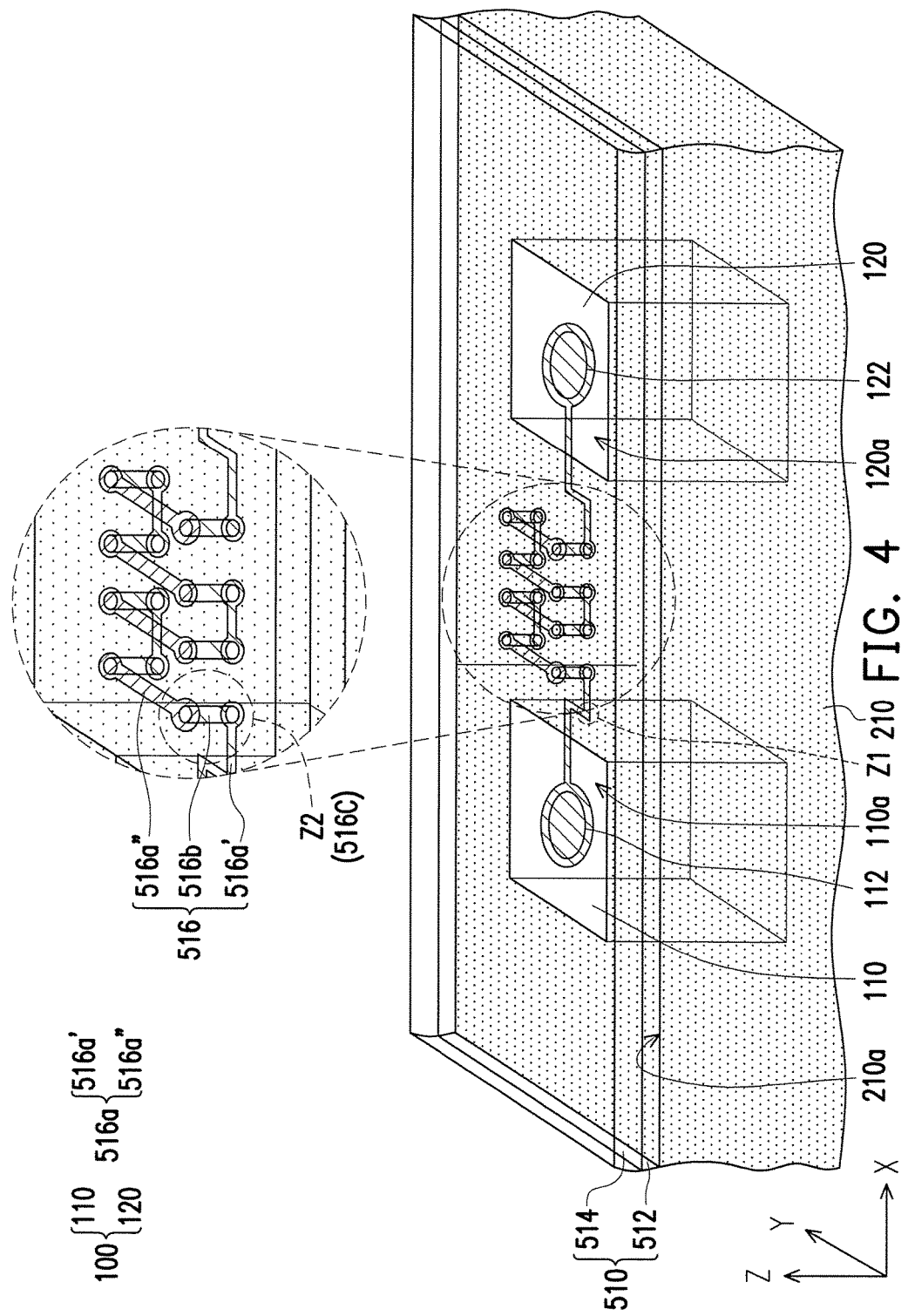
FIG. 4 is the schematic perspective view illustrating a semiconductor structure according to some embodiments of the present disclosure.

FIG. 4 is the schematic perspective view illustrating a semiconductor structure according to some embodiments of the present disclosure. Referring to FIG. 4, a semiconductor structure 30 of the present embodiment is similar as the combination of the semiconductor structure 10 of the embodiment illustrated in FIGS. 2A and 2B and the semiconductor structure 20 of the embodiment illustrated in FIGS. 3A and 3B. The identical or similar numbers refer to the identical or similar elements throughout the drawings, and the detail thereof is not repeated. The difference among the semiconductor structure 30, the semiconductor structure 10 and the semiconductor structure 20 lies in the routing of the conductive trace 516 of the redistribution circuit layer 510.

The first trace 516a of the conductive trace 516 (or referred as the zigzag conductive pattern) including a first level 516a' and/or a second level 516a" may be formed as the turning segments (as the slash area of circle Z1 in FIG. 4) corresponding to the insulating encapsulant 210. The forming processes of the first trace 516a may be similar as the embodiments illustrated in FIG. 2A and FIG. 2B and the detailed descriptions are simplified. For example, the first dielectric layer 512 may be formed and patterned to have openings (not illustrated) on the semiconductor dies 100 and the insulating encapsulant 210. Subsequently, the first level 516a' of the first trace 516a may be formed in the openings and on the first dielectric layer 512 such that the first level 516a' of the first trace 516a may include the turning segments in the top view. In some other embodiments, the second level 516a" of the first trace 516a may include the turning segments (or referred as the zigzag conductive pattern) in the top view. For example, the second dielectric layer 514 may be formed on the first dielectric layer 512 and patterned to have openings (not illustrated) exposing a portion of the conductive vias 516b. The second level 516a" of the first trace 516a may be formed in the openings to electrically connect to the conductive vias 516b and formed on the second dielectric layer 514 such that the second level 516a" may include the turning segments in the top view. As such, the total length of the conductive trace 516 may be increased.

In some embodiments, the turning segments of the conductive trace 516 (as the slash area of circle Z2 in FIG. 4) may include the conductive vias 516b with part of the first level 516a' and the second level 516a" of the first trace 516a connected to the conductive vias 516b and the turning segments may also be referred as the zigzag conductive pattern. The forming processes of the turning segments (as the slash area of circle Z2 in FIG. 4) may be similar with the slash area of circle Z in FIG. 3B and the detailed descriptions are omitted. In some embodiments, the first trace 516a may be located at a first plane (not illustrated) substantially parallel to the active surfaces (e.g. 110a and 110b) of the semiconductor dies 100, and the second trace 516c including the conductive vias 516b may be located at a second plane (not illustrated) substantially perpendicular to the active surfaces (e.g. 110a and 110b) of the semiconductor dies 100.

Since the conductive trace 516 including turning segments to increase the total length thereof, the semiconductor structure 30 may withstand the tensile stress resulting from the CTE mismatch between the semiconductor dies 100 and the insulating encapsulant 210 and eliminate the negative effect causing by the crack of the redistribution circuit layer 510 such that the reliability of the semiconductor structure 30 may be improved.

According to some embodiments, a semiconductor structure including an insulating encapsulant, a first semiconductor die, a second semiconductor die and a redistribution circuit layer is provided. The first semiconductor die is embedded in the insulating encapsulant. The first semiconductor die includes a first active surface accessibly exposed by the insulating encapsulant and a first conductive terminal distributed at the first active surface. The second semiconductor die is embedded in the insulating encapsulant and separated from the first semiconductor die. The second semiconductor die includes a second active surface accessibly exposed by the insulating encapsulant and a second conductive terminal distributed at the second active surface. The redistribution circuit layer is disposed on the first active surface of the first semiconductor die, the second active surface of the second semiconductor die and the insulating encapsulant. The redistribution circuit layer includes a conductive trace. The conductive trace is electrically connected from the first semiconductor die and meanderingly extends to the second semiconductor die. A ratio of a total length of the conductive trace to the top width of the insulating encapsulant ranges from about 3 to about 10.

According to some alternative embodiments, a semiconductor structure including an insulating encapsulant, a first semiconductor die, a second semiconductor die and a conductive trace is provided. The first semiconductor die is embedded in the insulating encapsulant. The first semiconductor die includes a first active surface accessibly exposed by the insulating encapsulant and a first conductive terminal distributed at the first active surface. The second semiconductor die is embedded in the insulating encapsulant and separated from the first semiconductor die. The second semiconductor die includes a second active surface accessibly exposed by the insulating encapsulant and a second conductive terminal distributed at the second active surface. The conductive trace extends from the first conductive terminal to the second conductive terminal to electrically connect between the first semiconductor die and the second semiconductor die. A total length of the conductive trace is greater than a shortest distance between the first semiconductor conductive terminal and the second semiconductor conductive terminal, and the total length of the conductive trace is at least 3 times greater than the top width of the insulating encapsulant.

According to some alternative embodiments, a semiconductor structure including a plurality of semiconductor dies, an insulating encapsulant and a redistribution circuit layer is provided. Each of the semiconductor dies comprises an active surface. The insulating encapsulant laterally encapsulates the semiconductor dies. The semiconductor dies are spaced apart from one another by the insulating encapsulant. The redistribution circuit layer is disposed on the active surfaces of the semiconductor dies and the insulating encapsulant. The redistribution circuit layer includes a zigzag conductive pattern corresponding to the insulating encapsulant and electrically connected between the semiconductor dies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor structure, comprising:
   an insulating encapsulant;
   a first semiconductor die embedded in the insulating encapsulant, wherein the first semiconductor die comprises a first active surface accessibly exposed by the insulating encapsulant and a first conductive terminal distributed at the first active surface;
   a second semiconductor die embedded in the insulating encapsulant and separated from the first semiconductor die, wherein the second semiconductor die comprises a second active surface accessibly exposed by the insulating encapsulant and a second conductive terminal distributed at the second active surface; and
   a redistribution circuit layer disposed on the first active surface of the first semiconductor die, the second active surface of the second semiconductor die and the insulating encapsulant, the redistribution circuit layer comprising a conductive trace, wherein the conductive trace is electrically connected from the first semiconductor die and meanderingly extends to the second semiconductor die, and a ratio of a total length of the conductive trace to a top width of the insulating encapsulant between the first semiconductor die and the second semiconductor die ranges from about 3 to about 10.

2. The semiconductor structure according to claim 1, wherein a shortest distance between the first conductive terminal and the second conductive terminal is greater than the top width of the insulating encapsulant.

3. The semiconductor structure according to claim 1, wherein the conductive trace is electrically connected between the first conductive terminal of the first semiconductor die and the second conductive terminal of the second semiconductor die.

4. The semiconductor structure according to claim 1, wherein a gap is between the first semiconductor die and the second semiconductor die, and the insulating encapsulant fills the gap.

5. The semiconductor structure according to claim 1, wherein the conductive trace of the redistribution circuit layer comprises at least one turning segment located above the insulating encapsulant.

6. The semiconductor structure according to claim 5, wherein the at least one turning segment of the conductive trace is located at a plane substantially parallel to the first active surface of the first semiconductor die and the second active surface of the second semiconductor die.

7. The semiconductor structure according to claim 5, wherein the at least one turning segment of the conductive trace is located at a plane substantially perpendicular to the first active surface of the first semiconductor die and the second active surface of the second semiconductor die.

8. The semiconductor structure according to claim 5, wherein the at least one turning segment of the conductive trace comprises a first trace and a second trace connected to the first trace, the first trace is located at a first plane substantially parallel to the first active surface and the second active surface, and the second trace is located at a second plane substantially perpendicular to the first active surface of the first semiconductor die and the second active surface of the second semiconductor die.

9. A semiconductor structure, comprising:
   an insulating encapsulant;
   a first semiconductor die embedded in the insulating encapsulant, wherein the first semiconductor die comprises a first active surface accessibly exposed by the insulating encapsulant and a first conductive terminal distributed at the first active surface;
   a second semiconductor die embedded in the insulating encapsulant and separated from the first semiconductor die, wherein the second semiconductor die comprises a second active surface accessibly exposed by the insulating encapsulant and a second conductive terminal distributed at the second active surface; and
   a conductive trace meanderingly extending from the first conductive terminal to the second conductive terminal to electrically connect between the first semiconductor die and the second semiconductor die, wherein a total length of the conductive trace is greater than a shortest distance between the first conductive terminal and the second conductive terminal, and the total length of the conductive trace is at least 3 times greater than a top width of the insulating encapsulant between the first semiconductor die and the second semiconductor die.

10. The semiconductor structure according to claim 9, wherein the shortest distance between the first conductive terminal and the second conductive terminal is less than 3 times of the top width of the insulating encapsulant.

11. The semiconductor structure according to claim 9, wherein a gap is between the first semiconductor die and the second semiconductor die, and the insulating encapsulant fills the gap.

12. The semiconductor structure according to claim 9, wherein the conductive trace comprises at least one turning segment, the at least one turning segment is located at a plane substantially parallel to the first active surface of the first semiconductor die and the second active surface of the second semiconductor die.

13. The semiconductor structure according to claim 9, wherein the conductive trace comprises at least one turning segment, the at least one turning segment is located at a plane substantially perpendicular to the first active surface of the first semiconductor die and the second active surface of the second semiconductor die.

14. The semiconductor structure according to claim 9, wherein the conductive trace comprises a first trace and a second trace connected to the first trace, the first trace is located at a first plane substantially parallel to the first active surface and the second active surface, and the second trace is located at a second plane substantially perpendicular to the first active surface of the first semiconductor die and the second active surface of the second semiconductor die.

15. A semiconductor structure, comprising:
   a plurality of semiconductor dies, wherein each of the semiconductor dies comprises an active surface;
   an insulating encapsulant laterally encapsulating the semiconductor dies, wherein the semiconductor dies are spaced apart from one another by the insulating encapsulant; and
   a redistribution circuit layer disposed on the active surfaces of the semiconductor dies and the insulating encapsulant, wherein the redistribution circuit layer comprises a zigzag conductive pattern corresponding to the insulating encapsulant and electrically connected between the semiconductor dies.

16. The semiconductor structure according to claim 15, wherein a shortest distance between two of the semiconductor dies adjacent to each other is greater than a top width of the insulating encapsulant that fills a gap between the two of the semiconductor dies adjacent to each other.

17. The semiconductor structure according to claim 15, wherein the zigzag conductive pattern of the redistribution circuit layer is located at a plane substantially parallel to the active surfaces of the semiconductor dies.

18. The semiconductor structure according to claim 15, wherein the zigzag conductive pattern of the redistribution circuit layer is located at a plane substantially perpendicular to the active surfaces of the semiconductor dies.

19. The semiconductor structure according to claim 15, wherein the zigzag conductive pattern comprises a first trace and a second trace connected to the first trace, the first trace is located at a first plane substantially parallel to the active surfaces of the semiconductor dies, and the second trace is located at a second plane substantially perpendicular to the active surfaces of the semiconductor dies.

20. The semiconductor structure according to claim 15, wherein each of the semiconductor dies comprises a conductive terminal distributed at the active surface thereof, and the zigzag conductive pattern of the redistribution circuit layer is electrically connected to the conductive terminals of the semiconductor dies.

\* \* \* \* \*